United States Patent [19]
Freidin

[11] Patent Number: 5,726,584
[45] Date of Patent: Mar. 10, 1998

[54] VIRTUAL HIGH DENSITY PROGRAMMABLE INTEGRATED CIRCUIT HAVING ADDRESSABLE SHARED MEMORY CELLS

[75] Inventor: Philip M. Freidin, Sunnyvale, Calif.

[73] Assignee: Xilinx, Inc., San Jose, Calif.

[21] Appl. No.: 619,286

[22] Filed: Mar. 18, 1996

[51] Int. Cl.$^6$ .......................... H03K 19/173; H03K 7/38
[52] U.S. Cl. .................................. 326/38; 326/39
[58] Field of Search .................................. 326/38, 39

[56] References Cited

U.S. PATENT DOCUMENTS

| | | | |
|---|---|---|---|
| Re. 34,363 | 8/1993 | Freeman . | |
| 4,642,487 | 2/1987 | Carter . | |
| 4,706,216 | 11/1987 | Carter | 365/94 |
| 4,940,909 | 7/1990 | Mulder et al. | 326/38 |
| 5,410,194 | 4/1995 | Freidin | 326/46 |
| 5,426,378 | 6/1995 | Ong | 326/39 |
| 5,469,003 | 11/1995 | Kean | 326/39 |
| 5,559,450 | 9/1996 | Ngai et al. | 326/39 |
| 5,600,263 | 2/1997 | Trimberger et al. | 326/39 |
| 5,629,637 | 5/1997 | Trimberger et al. | 326/38 |

OTHER PUBLICATIONS

N.B. Bhat., et al., "Performance Oriented Fully Routable Dynamic Architecture for a Field Programmable Logic Device", Electronics Research Laboratory of U.C. Berkeley, Jun. 1, 1993.

*Primary Examiner*—Edward P. Westin
*Assistant Examiner*—Richard Roseen
*Attorney, Agent, or Firm*—Anthony C. Murabito; Jeanette S. Harms

[57] ABSTRACT

A virtual high density architecture having shared memory cells for a programmable integrated circuit (IC) is provided. The architecture includes logic modules, a configuration memory unit (CMU), and a global interconnect memory (GIMU) unit. A logic cycle is divided into a number of time intervals. For each time interval, the CMU outputs information to configure the logic modules and the interconnect structure to realize an individual circuit stage of a circuit. Input and output data pertinent to this individual stage are retrieved from and stored in the GIMU based on addressing information generated from the CMU for each time interval. The CMU continuously reprograms the logic modules and interconnect structure for each time interval to realize different stages of the circuit while information used between stages is stored in the GIMU. The architecture reuses the IC's complement of logic and other functional elements continuously during a logic cycle to implement the circuit as a series of circuit stages over time using a relatively limited number of logic and other functional elements to implement each stage. The GIMU is coupled to address and data buses and the data bus is coupled to each logic module. The GIMU contains individually addressable memory cells that are shared between logic modules across different time intervals providing an extremely flexible signal path between logic modules. The GIMU has a separate read and write port for each logic module.

22 Claims, 15 Drawing Sheets

VIRTUAL HIGH DENSITY PROGRAMMABLE INTEGRATED CIRCUIT HAVING ADDRESSABLE SHARED MEMORY CELLS

BACKGROUND OF THE INVENTION

1. Field of the Invention

The field of the present invention relates to programmable integrated circuit designs. More specifically, the present invention relates to a virtual density field programmable gate array.

2. Background Technology

The present invention relates to programmable integrated circuits. One type of programmable integrated circuit is the field programmable gate array ("FPGA") which includes several configurable logic blocks (CLBs) and a programmable interconnect structure for signal routing between CLBs. The programmable interconnect structure also links input/output blocks (IOBs) which provide interfaces between internal circuitry of the FPGA and external signals received or supplied over pads. The FPGA is referred to as "field programmable" because the above logic modules can be interconnected and configured at the user's facility by means of special programming hardware and software.

FPGAs are well known in the art, and are described in detail in U.S. Pat. No. 4,642,487, issuing Feb. 10, 1987, to W. Carter and entitled "Special Interconnect For Configurable Logic Array;" U.S. Pat. No. 4,706,216 issuing Nov. 10, 1987, to W. Carter and entitled "Configurable Logic Element;" and U.S. Pat. No. RE 34,363 issuing Aug. 31, 1993, to R. Freeman and entitled "Configurable Electrical Circuit Having Configurable Logic Elements and Configurable Interconnects." An exemplary FPGA 100 is shown in FIG. 1. The FPGA 100 contains an array of CLBs 110 and a number of IOBs 115. Each CLB 110 typically includes circuitry which functions as a logic gate, or series of gates (e.g., an AND gate, flip-flop, latch, inverter, NOR gate, exclusive OR gate, etc.), and/or combinations of these gates, thereby forming complex functions. The particular function performed by a CLB 110 is determined by program data ("information") that is provided to that CLB 110 during programming. The programmable interconnect structures (not shown in FIG. 1) contain programmable interconnect points (PIPs) at the cross points of signal lines and also contain vertical and horizontal long lines that run substantially the length and width of the FPGA 100. Optionally, decoders 112 can be placed near the IOBs 115 within the periphery of the FPGA 100. In the embodiment shown, the programmable interconnect structure includes buffers 120 and 117.

Programmable logic generates, stores, and transfers the program signals (e.g., program information) that set the configuration of each CLB 110. Program logic is formed integrally within the FPGA 100 or, alternatively, is stored and/or generated outside of the FPGA 100 and then transmitted to the CLBs 110. The program logic also programs the programmable interconnect structure to provide signal routing between CLBs 110, IOBs 115, decoders 112, and other logic elements of the FPGA 100.

When the FPGA 100 is initialized (powered-up), all of the programmable logic and the interconnect structures in the CLBs 110 are actively programmed to implement the desired configuration for the FPGA 100. Typically, the program information generated by the program logic is stored in nonvolatile memory and then is transferred to volatile memory within the FPGA 100. Program information is maintained in volatile memory within the FPGA 100 and is maintained as long as the FPGA 100 is powered. Upon power down, the configuration is eliminated until the next power-up. Accordingly, typical FPGAs perform the same defined logic function once they are programmed. However, upon power up, an FPGA 100 can also be re-configured by a new set of program information.

Although the functionality and density of FPGAs are increasing, signal routing limitations prevent full functionality of the FPGA 100. In other cases, depending on the array size of the FPGA 100, the logic within the CLBs is insufficient to realize a complex design. In some instances, it is undesirable to use a higher capacity FPGA to provide the design because of the additional cost per unit. For certain applications, e.g., when a relatively slower clock speed will suffice or when clock speed is not a critical factor, it would be advantageous to provide an FPGA having a relatively limited array size that could nevertheless satisfy designs having complex functions. It would be advantageous to offer the above functionality in an FPGA that also did not have substantial signal routing limitations. In a more general case, it would be a significant advance in the art if the logic and other functional elements of an FPGA could be more fully exploited, while at the same time providing both flexible and efficient signal routing across the FPGA. The present invention provides these advantageous functions.

Some programmable logic devices (e.g., FPGAs) reconfigure the CLBs during operation, over discrete periods of time, to realize virtual circuits. One such device is described in U.S. Pat. 5,426,378 by R. T. Ong, issuing on Jun. 20, 1995. Another device is described in a reference entitled "Performance-Oriented Fully Routable Dynamic Architecture for a Field Programmable Logic Device," by N. B. Bhat, et al., published in Electronics Research Laboratory of U. C. Berkeley, Jun. 1, 1993. These FPGA devices associate individual memory cells with the individual CLBs that output to them. In other words, in these device configurations, memory cells are not allowed to receive information from CLBs with which they are not directly associated. Accordingly, a particular memory cell is always predetermined to receive the same signal or set of signals over any given time interval. In addition, the Bhat et al., design has significant signal routing layout problems when its CLB array size grows to any practical size. Therefore, a need arises for an FPGA that allows reconfiguration but also that provides more flexibility in the storing of signals generated by its CLBs. The present invention provides this storage flexibility. More particularly, what is needed is an FPGA that offers flexible memory addressing and signal routing to and from memory cells containing signals resulting from CLB computations, discussed above. The present invention provides this routing flexibility.

SUMMARY OF THE INVENTION

A virtual high density architecture is described having shared memory cells for a programmable integrated circuit (IC), such as a field programmable gate array. The architecture includes configurable logic modules (e.g., CLBs, logic modules, programmable logic modules, etc.) and a programmable interconnect structure for coupling the configurable logic modules. The architecture also includes a Configuration Memory unit (CMU) and a Global Interconnect Memory (GIMU) unit. The GIMU is coupled to an address bus and coupled to a data bus. The data bus is coupled to each logic module. The GIMU contains individually addressable memory cells that are shared between logic modules across different time intervals providing an extremely flexible signal path between logic modules. Memory cells are not constrained to receive output signals from the same logic modules, as done in the past. Instead, memory cells of the GIMU are fully addressable for flexible reading and writing of information from and to the logic modules. The GIMU contains a separate read and write port for each logic module of the architecture.

A logic cycle is divided into a number of time intervals. For each time interval, the CMU outputs information to configure the logic module and the interconnect structure to realize an individual circuit stage of a complex logic circuit input and output data (including states, signal values, etc.) pertinent to this individual circuit stage are retrieved from and stored in the GIMU based on addressing information generated from the CMU for each time interval. The CMU continuously reprograms the logic modules and interconnect structure at each time interval to realize different circuit stages of the complex function while information used between circuit stages is stored in the GIMU. The architecture reuses the IC's complement of logic and other functional modules continuously during a logic cycle to implement the circuit as a series of circuit stages over time using a relatively limited number of logic and other functional elements to implement each stage. In this way, the functionality (and therefore virtual density) of the device is multiplied by the number of time intervals used.

In one embodiment of the present invention, a programmable integrated circuit includes a plurality of programmable logic modules coupled to a configuration bus to receive programming information, wherein the programming information configures each of the plurality of programmable logic modules to perform a specified function; a first memory coupled to the configuration bus for containing a plurality of programming information used to program the plurality of programmable logic modules, wherein the first memory is for supplying the plurality of programming information over a plurality of time intervals to the plurality of programmable logic modules; and a second memory for storing results of the plurality of programmable logic modules generated at a completion of a time interval and for supplying input signals for the plurality of programmable logic modules at a start of a time interval, the second memory having individual memory cells for receiving results from different programmable logic modules over a plurality of time intervals. In one configuration, the second memory comprises a read port and a write port for each programmable logic module, wherein the second memory is coupled to and addressed by a configuration bus.

In some embodiments, the plurality of programming information includes configuration information to configure the plurality of logic modules for a time interval, and read and write addressing information for addressing the read and write ports of the second memory for the time interval. In yet other embodiments, the present invention comprises a data bus coupled to the plurality of programmable logic modules and to the second memory. In those embodiments, the data bus supplies the results to the second memory and the input signals to the plurality of programmable logic modules from the second memory.

DETAILED DESCRIPTION OF THE INVENTION

The present invention includes an architecture for a programmable integrated circuit (IC) that continuously reprograms configurable logic blocks (CLBs),(input/output blocks (IOB), and programmable interconnect structures to realize different stages of a circuit. In so doing, a relatively limited number of gates are used to realize a relatively circuit. The circuit is divided into circuit stages with each circuit stage implemented in a time interval of a logic cycle. The logic cycle is composed of a series of time intervals and the circuit is realized over a series of time intervals. The control information used to program each stage and control the storing and retrieving of information used between stages is stored in a first array of memory cells and the information passed between circuit stages is stored in a second array of memory cells. The second array contains memory cells that are individually shared such that multiple CLBs write data to the same cell over multiple time intervals. To accomplish this, the second memory has separate read and write ports for each CLB to allow flexible access to the individual memory cells by the CLBs.

By reusing the complement of logic and programmable interconnect resources of the IC in multiple time intervals, each interval providing an individual circuit stage, to form a larger complex function, the present invention provides "virtual density" within the IC. In other words, each time the circuitry of a CLB is reused in a circuit stage of a time interval to form complex functions, this CLB is "virtually" duplicated.

I. VIRTUAL CIRCUIT REALIZED OVER MULTIPLE TIME INTERVALS

Figure 1:
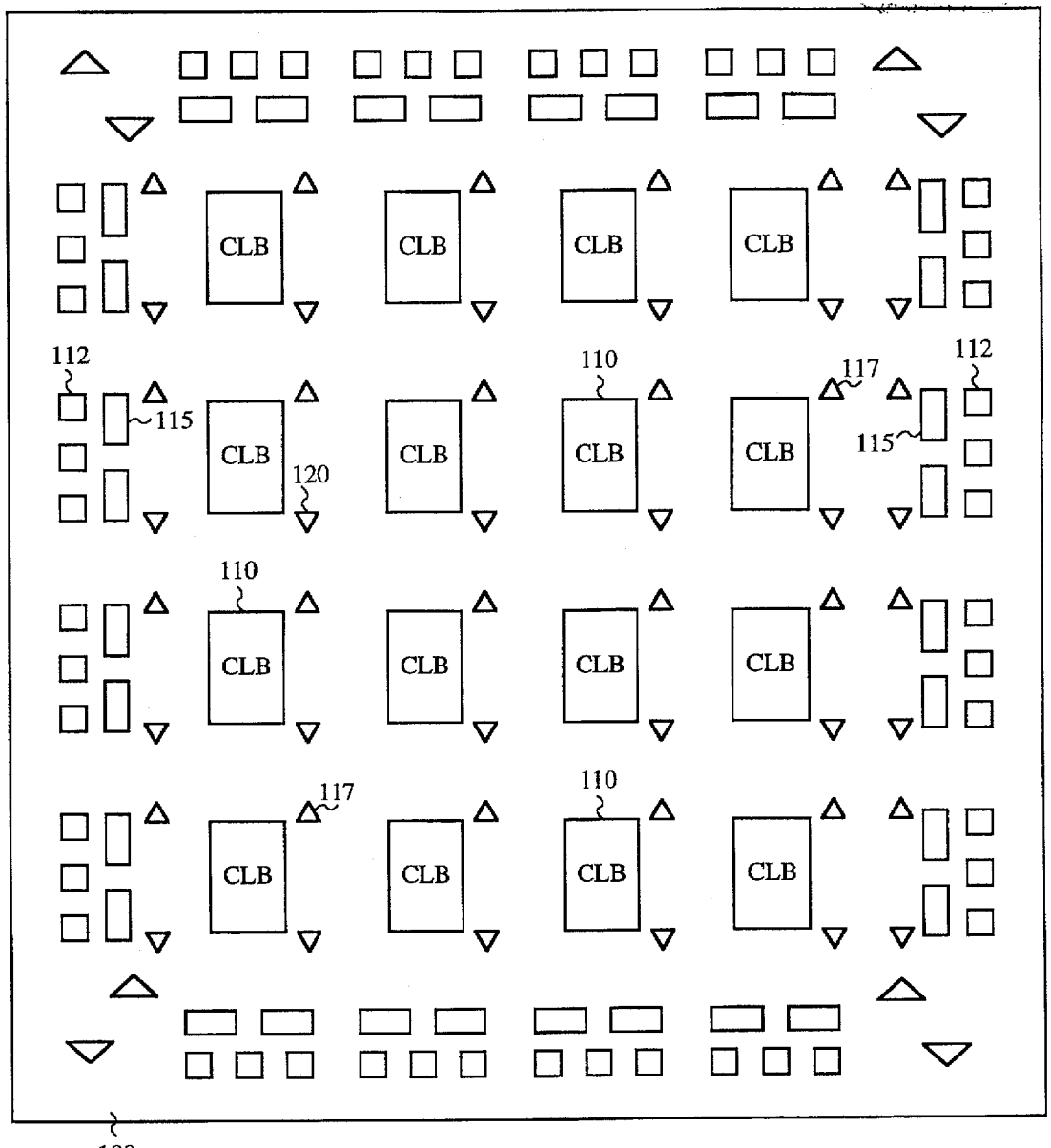
FIG. 1 illustrates a programmable integrated circuit including an array of CLBs, a plurality of programmable IOBs, decoders, and buffers.
Figure 2:
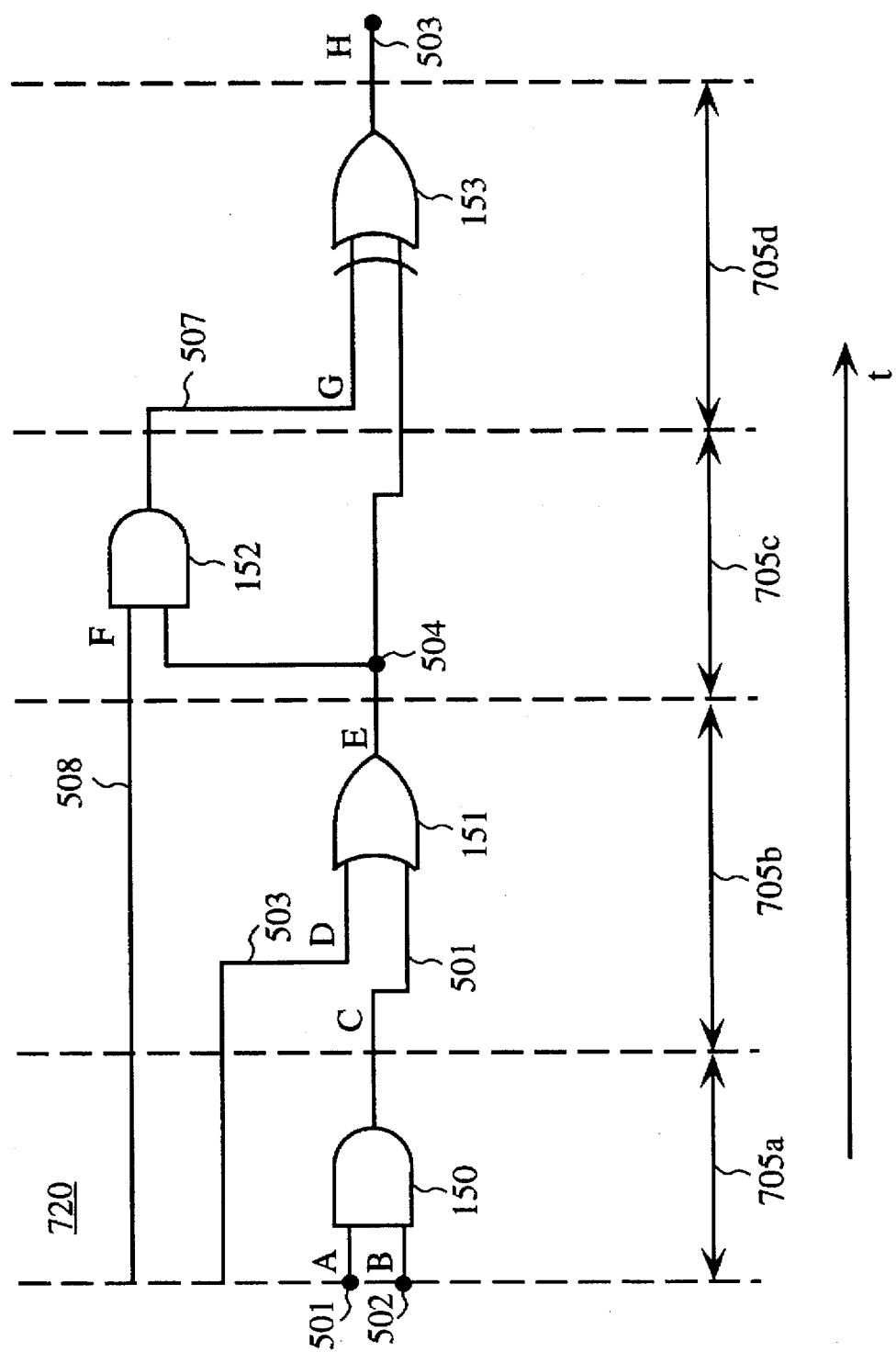
FIG. 2 is a schematic diagram of a circuit realized by the present invention in four time intervals, each time interval representing a circuit stage.

FIG. 2 illustrates a circuit 720 including gates 150, 151, 152 and 153. Circuit 720 receives signals A, B, D, and F and produces signal H. Four separate time intervals, 705a–d are shown, wherein each time interval represents an individual stage of circuit 720. A single function generator of a CLB 110 (FIG. 1) is used to realize gates 150, 151, 152 and 153 of circuit 720. That CLB 110 is reprogrammed in accordance with the present invention to realize AND gate 150 during the time interval 705a, to realize OR gate 151 during the subsequent time interval 705b, to realize AND gate 152 during the next time interval 705c, and to realize XOR gate 153 during the final time interval 705d. Therefore, circuit 720 requires four time intervals to produce the output signal H from the input signals A, B, D and F. A configuration memory unit (described below with reference to FIG. 3) provides the proper configuration information during each time interval to program the CLB 110 to realize the proper gate at each time interval. The logic cycle for circuit 720 comprises time intervals 705a–d.

In accordance with the present invention, the data (e.g., the signals) that flow between the circuit stages (e.g. between individual time intervals 705a–705d) are stored in individually addressable memory cells within a global interconnect memory unit (described with reference to FIG. 3) which is accessed at the start of each time interval to retrieve the input information and is accessed at the end of each time interval to store the output information for each stage. Any individual memory cell can be addressed for reading or for writing by any CLB. For instance, signals A and B are retrieved from exemplary locations 501 and 502, respectively, at the start of time interval 705a; whereas the output signal of AND gate 150, signal C, is stored in location 501 at the end of time interval 705a. Signal D is retrieved from memory location 503; signal C is retrieved from location 501 at the start of time interval 705b; whereas the output signal E provided by OR gate 151 is stored in location 504 at the end of time interval 705b. Signals F and E are retrieved at the start of time interval 705c from locations 508 and 504, respectively; whereas signal G, the output signal of AND gate 152, is stored in location 507 at the end of time interval 705c. Finally, signals G and E are retrieved from locations 507 and 504, respectively, at the start of time interval 705d; whereas signal H is stored in location 503 at the end of time interval 705d.

Note that both signals H and D are stored in memory cell location 503. In accordance with this embodiment of the present invention, location 503 is shared between both XOR gate 153 and the gate (not shown) producing value D. In a similar manner, signals A and C are stored in memory cell location 501 but at different times.

In summary, circuit 720 of FIG. 2 is realized by programming a single CLB 110 over four time intervals 705a–705d, each time interval having an individual circuit stage that passes information between its adjacent stages by retrieving and storing information to and from an addressable array of memory cells. By time multiplexing the use of a single CLB 110 to realize four separate circuit stages, the gates of the CLB 110 are effectively duplicated four times and, in accordance with the present invention and this exemplary circuit 720, represent a set of four "virtual" CLBs.

II. CIRCUIT ARCHITECTURE

FUNCTION GENERATOR AND FLIP-FLOP MODULES

Figure 3:
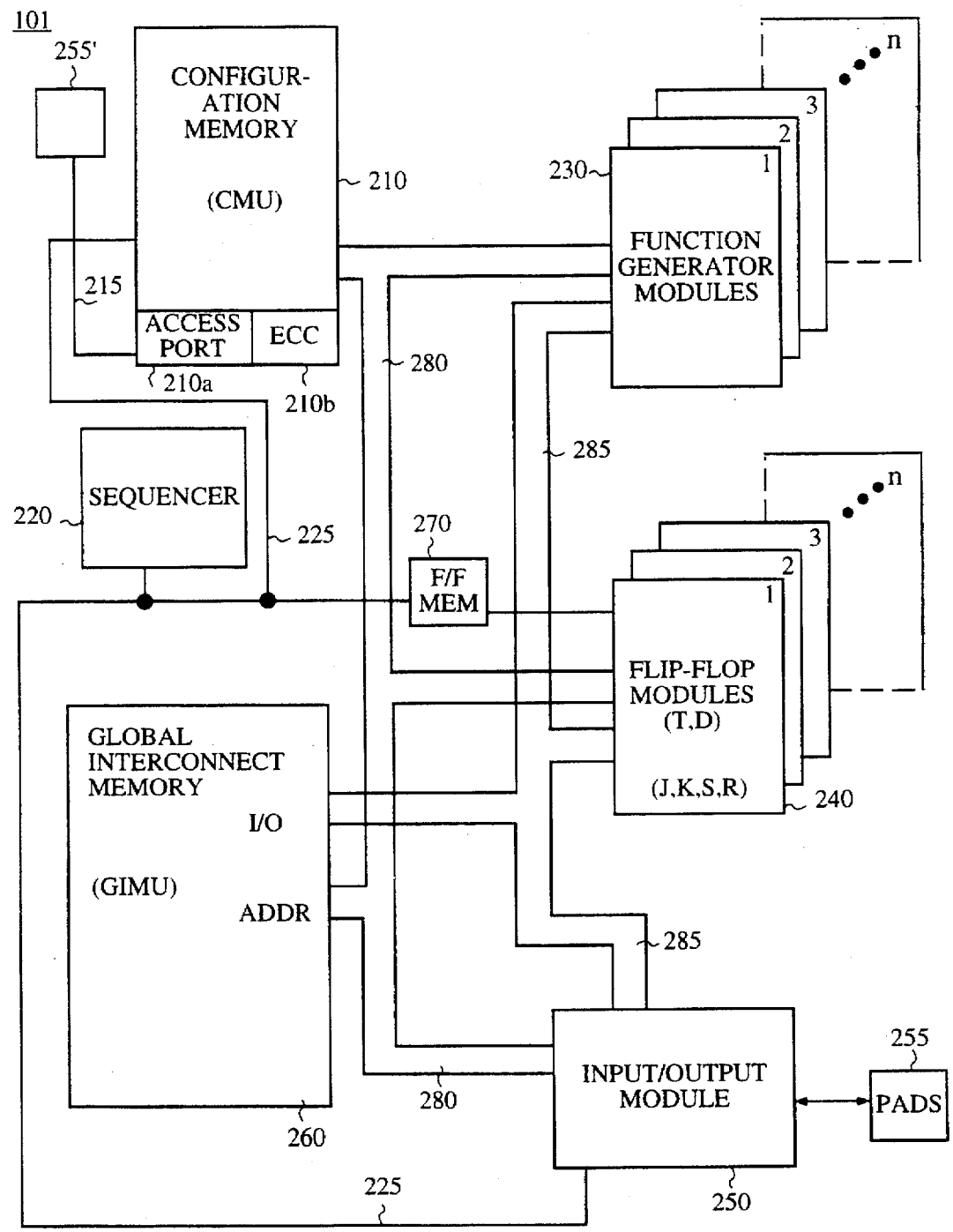
FIG. 3 is a logical block diagram of a programmable integrated circuit architecture in accordance with the present invention.

FIG. 3 illustrates an overview of an exemplary circuit architecture 101 in accordance with the present invention. In this architecture, a number of function generator modules (e.g., 1 to n) 230 are individually coupled to an address/control bus 280 and also individually coupled to a data I/O bus 285. In one embodiment, these function generator modules 230 are included in a CLB, wherein the CLB receives four input signals and generates one output signal. However, in other embodiments, different numbers of input and/or output signals are used.

Additionally, there are a number of flip-flop modules (e.g., 1 to n) 240 which are also individually coupled to the address/control bus 280 as well as to the data I/O bus 285. The flip-flop modules 240 are also coupled to a flip-flop (F/F) memory circuit (FFMU) 270. In one embodiment, the combination of flip-flop modules 240 and the function generators 230 are functionally equivalent to prior art CLBs 110. In this embodiment of the present invention, the flip-flop modules 240 are configured to receive two input signals which are shared with function generators 230. In accordance with a mode signal, each flip-flop module 240 can realize a D, JK, SR, or T flip-flop. The function generator modules 230 and the flip-flop modules 240 are re-configured at each time interval by interval control words (e.g., a program) stored in Configuration Memory Unit (CMU) 210.

FIG. 3 also illustrates an input/output (I/O) module 250 which includes a number of individual I/O modules individually coupled to pads 255. External signals from outside the IC can be received over pads 255 and supplied to the I/O module 255. Likewise, internal signals generated by the IC can be supplied externally using I/O module 250 and pads 255. Each logic module within I/O module 250 may contain a function generator module 230 and/or a flip-flop module 240. The data I/O bus 285 couples the I/O module 250 to the function generator modules 230, the flip-flop modules 240, and the global interconnect memory unit (GIMU) 260. The address/control bus 280 is coupled to the i/O module 250, the function generator modules 230, the flip-flop modules 240, the GIMU 260 and a configuration memory unit (CMU) 210. The CMU 210 configures the function generator modules 230 and/or flip flop modules 240 within I/O module 250 over address/control bus 280.

CONFIGURATION MEMORY UNIT

In an exemplary configuration, CMU 210 is a 4 Megabit memory array (e.g., a DRAM array having 2048 locations, each location storing 2048 bits). The CMU 210 generates signals over the address/control bus 280 during each time interval (FIG. 2) to provide configuration information to the function generators 230, the flip-flop modules 240, and the I/O modules 250. The CMU 210 configures each function generator 230 and each flip flop module 240 at the start of any given time interval using address/control bus 280, thereby allowing an entirely different or modified function to be implemented during each time interval. The CMU 210 also configures any programmable interconnect structure within architecture 101. Importantly, the CMU 210 also addresses the GIMU 260 over address/control bus 280. The CMU 210 is itself addressed by a sequencer 220 which presents address values over address bus 225. Sequencer 220 provides a different address over bus 225 for each time interval; each addressable location of the CMU 210 stores an interval control word.

An access port 210a of the CMU 210 allows external reading and writing of the CMU 210 so that the configuration information stored therein can be readily updated. In one embodiment of the present invention, port 210a is coupled via lines 215 to pads 255' that are coupled to an external set of pins of the IC, thereby allowing port 210a to either receive data externally or internally from the local interconnect structure of the IC. The CMU 210 may contain an error checking and correction circuit ECC 210b which is well known in the art and therefore not explained in detail herein. In one embodiment, the CMU is reprogrammed at the end of a time interval using signals produced by architecture 101. In another embodiment, the CMU 210 is reprogrammed in an adaptive manner during a logic cycle so that the functionality of architecture 101 is altered during operation (i.e. re-configured on the fly).

Figure 4:
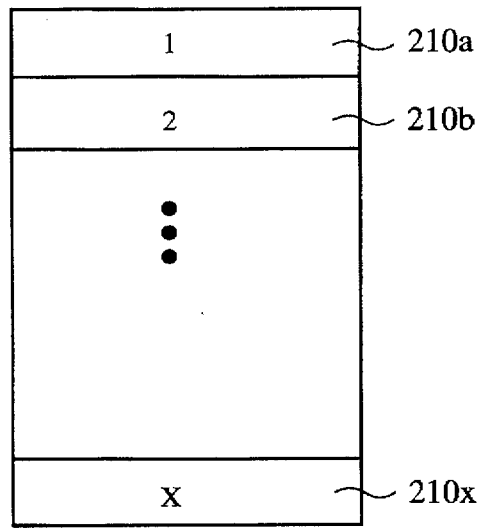
FIG. 4 is a logical diagram of the memory organization of the Configuration Memory Unit of the present invention.

FIG. 4 is a logical diagram of the structure of CMU 210 for the general case containing x addressable locations 210a–210x. Each addressable location 210a–210x contains an interval control word which represents data associated with a single time interval. In the example shown in FIG. 4, there are x possible time intervals per logic cycle. In an exemplary embodiment, x=2048, and each addressable location 210a–210x represents 2048 bits. If sequencer 220 (FIG. 3) is operating at 100 MHz, then the addressable locations 210a–210x are addressed at a 100 MHz frequency, and each time interval lasts for 10 nanoseconds. In this example, a logic cycle of 2048 time intervals lasts 20.48 microseconds. Of course, the present invention can operate with different values for x and different sequencer 220 frequencies. The CMU 210 is implementable using volatile or nonvolatile memory elements, e.g., DRAM, SRAM, EPROM, EEPROM, and flash memory cells

GLOBAL INTERCONNECT MEMORY UNIT

As discussed above in reference to FIG. 3, the CMU 210 generates address signals to control the writing and reading of data to and from the GIMU 260. The GIMU 260 allows the storage and retrieval of signal information generated and required by the circuit stages from one time interval to another, thereby ensuring that results are maintained when the logic modules (e.g., function generator 230 and flip-flop 240 modules) are re-configured by the CMU 210 in a subsequent time interval. In this manner, data is readily passed between circuit stages of different time intervals. For example, the exemplary memory locations described with respect to FIG. 2 are stored in GIMU 260. The GIMU 260 receives information for storage during a data write cycle and supplies signals during a data read cycle via data I/O bus 285. The GIMU 260 is addressed by data supplied within an interval control word which is presented over address/control bus 280 when the CMU 210 is addressed by time interval sequencer 220.

In one embodiment, GIMU 260 includes a memory array having 2048 addressable locations with 1 bit storage per location. GIMU 260 is implementable using volatile memory elements, e.g., DRAM or SRAM cells, for example. Each logic module of the present invention has its own associated set of read/write ports in GIMU 260 to facilitate flexible access of individual memory cells contained therein. The GIMU 260 includes four read ports and at least one write port per function generator module (1 to n) 230. The GIMU 260 also includes at least one read port and at least one write port for each flip-flop module (1 to n) 240.

Since the GIMU 260 of FIG. 3 contains at least one read port and one write port for each programmable logic module, the present invention increases flexibility of information exchange between programmable logic modules. Moreover, each memory cell of the GIMU 260 can be shared by many different programmable logic modules across different time intervals. In effect, each memory location of the GIMU 260 is fully addressable by the CMU 210 and receives or supplies information to any other programmable logic module by the appropriate read and write addressing. This addressing flexibility advantage is in contrast to prior art systems that only allow results derived from programmable logic modules to be stored in individual sets of memory cells or latches that are stored in and dedicated to the module. In the past, the memory cells received input only from the CLB to which they were associated. These single memory cells or latches of the prior art are not fully addressable by each other logic module of the prior art IC designs.

In one embodiment, external access (not shown) to the GIMU 260 is provided while the architecture 101 is operating. In this manner, the architecture 101 allows external information to be used as input data or to modify the results contained in the GIMU 260 from one time interval to the next during a logic cycle. In one embodiment, caches are included in the CMU 210 and the GIMU 260, thereby improving the performance of the architecture 101. Implementations using data and instruction caches are well known in the art are therefore are not explained in detail herein.

TIME INTERVAL SEQUENCER

Time interval sequencer 220 (sequencer 220) is coupled to address CMU 210. In one embodiment, the sequencer 220 includes a clock and a counter which presents a new time interval at any clock rate up to 100 MHz and adjusts the time interval duration by programming a time constant. The sequencer 220 addresses the CMU 210 so that a new location (e.g., an interval control word of 2048 bits) within CMU 210 is presented over address/control bus 280 for each time interval. In one embodiment, 2048 different time intervals are possible per logic cycle. The sequencer 220 addresses FFMU 270 and I/O module 250 via bus 225. The sequencer 220 sequentially addresses the FFMU 270 so that a new location (e.g., each location containing as many bits are there are flip-flop modules 240) within FFMU 270 is accessed for each time interval.

In addition to varying the duration of a time interval, the sequencer 220 programably resets after any programmable number of time intervals, thereby allowing the number of time intervals per logic cycle to vary. For example, in one embodiment, sequencer 220 is reset or interrupted based on a defined condition generated by the function generator 230 and/or the flip-flop modules 240. This feature is useful for terminating a logic cycle before completion if an error or halt condition is encountered so that processing time is not wasted on circuit stages that do not need to be realized. In another embodiment of the present invention, the sequencer 220 is able to jump to any arbitrary count value (e.g., address value) under control and conditions of the present architecture.

FLIP-FLOP MEMORY UNIT

In accordance with the present invention, circuit architecture 101 includes a flip-flop memory unit (FFMU) 270 which is also addressed by the sequencer 220 over address bus 225. In one embodiment, FFMU 270 includes 2048 addressable locations and stores as many bits as there are flip-flop modules in each location (e.g., n bits). The FFMU 270 receives a different address from the CMU 210 for each time interval and generates a unique set of n bits for each interval, wherein n is the number of flip-flop modules 240. These n bits are used by the flip-flop modules 240, one bit each, to store the current state of each flip-flop at the completion of a time interval and to read a previously stored state from the prior logic cycle. In so doing, the FFMU 270 acts as a storage unit for the flip-flop modules 240 realized from one logic cycle to another and is an effective D flip-flop storage unit having a clock based on the logic cycle period. This feature is discussed in more detail with respect to FIG. 8. The FFMU 270 is implementable using volatile or non-volatile memory elements, e.g., DRAM, SRAM, EPROM, EEPROM, and flash memory cells.

III. FIELDS OF THE INTERVAL CONTROL WORDS

Figure 5A:
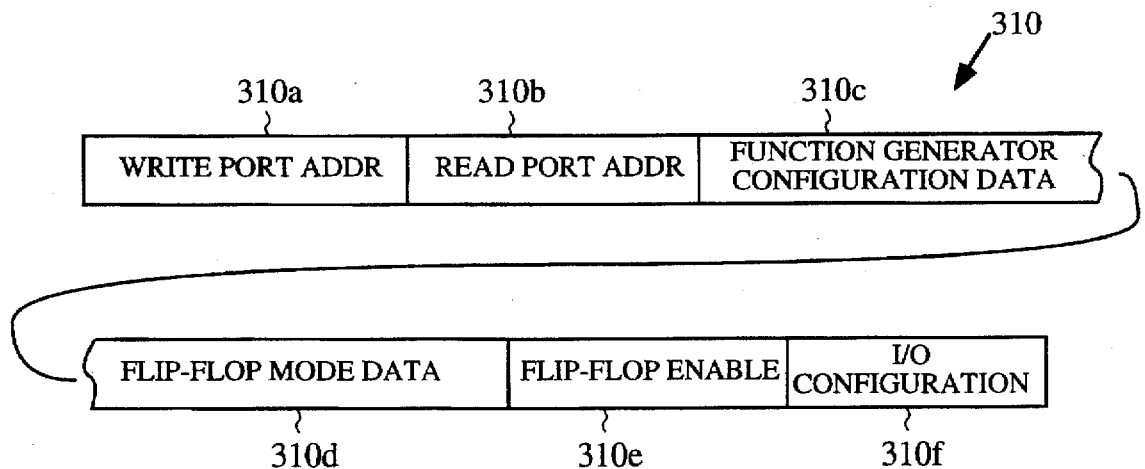
FIG. 5A is an illustration of the output information generated by the Configuration Memory Unit of the present invention for each time interval.

FIG. 5A illustrates the programming information within information fields of an interval control word 310 (in one embodiment 2048 bits long) supplied by the CMU 210 over the address/control bus 280 for each time interval. The time interval sequencer 220 addresses the CMU 210 (FIG. 3) to produce this interval control word 310 at the start of each time interval. Fields of the interval control word address the GIMU 260 and configure the logic modules of architecture 101. Specifically, interval control word 310 includes a field 310a that contains the write pore addresses for the write ports of the GIMU 260 (one address for each write port) and also includes a field 310b that contains the read port addresses for the read ports of the GIMU 260 (one address for each read port). In one embodiment, each address within fields 310a and 310b is 11 bits long. Interval control word 310 also includes configuration data 310c for configuring the functions of the function generator modules 230 and configuration data 310d (including mode data, T, JK, SR, D, etc.) for the flip-flop modules 240. Interval control word 310 also contains information field 310e which includes flip-flop enable data as well as information field 310f for the programmable interconnect structure.

In an exemplary embodiment, field 310a contains 4n read addresses for the function generators 230 and n read addresses for the flip-flop modules 240, thereby requiring 55n bits, (e.g., 11 bits (as previously described) ×5n). Field 310b consists of n write addresses for the function generators 230 and n write addresses for the flip-flop modules 240, thereby requiring 22n bits, (e.g., 11bits ×2n). Each function generator 230 requires 16 bits for configuration. Therefore, field 310c includes 16n bits. Field 310d and field 310e each typically utilize two bits per flip-flop, thereby each requiring 2n bits. Lastly, information field 310f for the I/O configuration varies depending on the size of the IC and can consume the balance of the bits allocated for each time interval in the exemplary configuration.

IV. PORT STRUCTURE OF THE GIMU

Figure 5B:
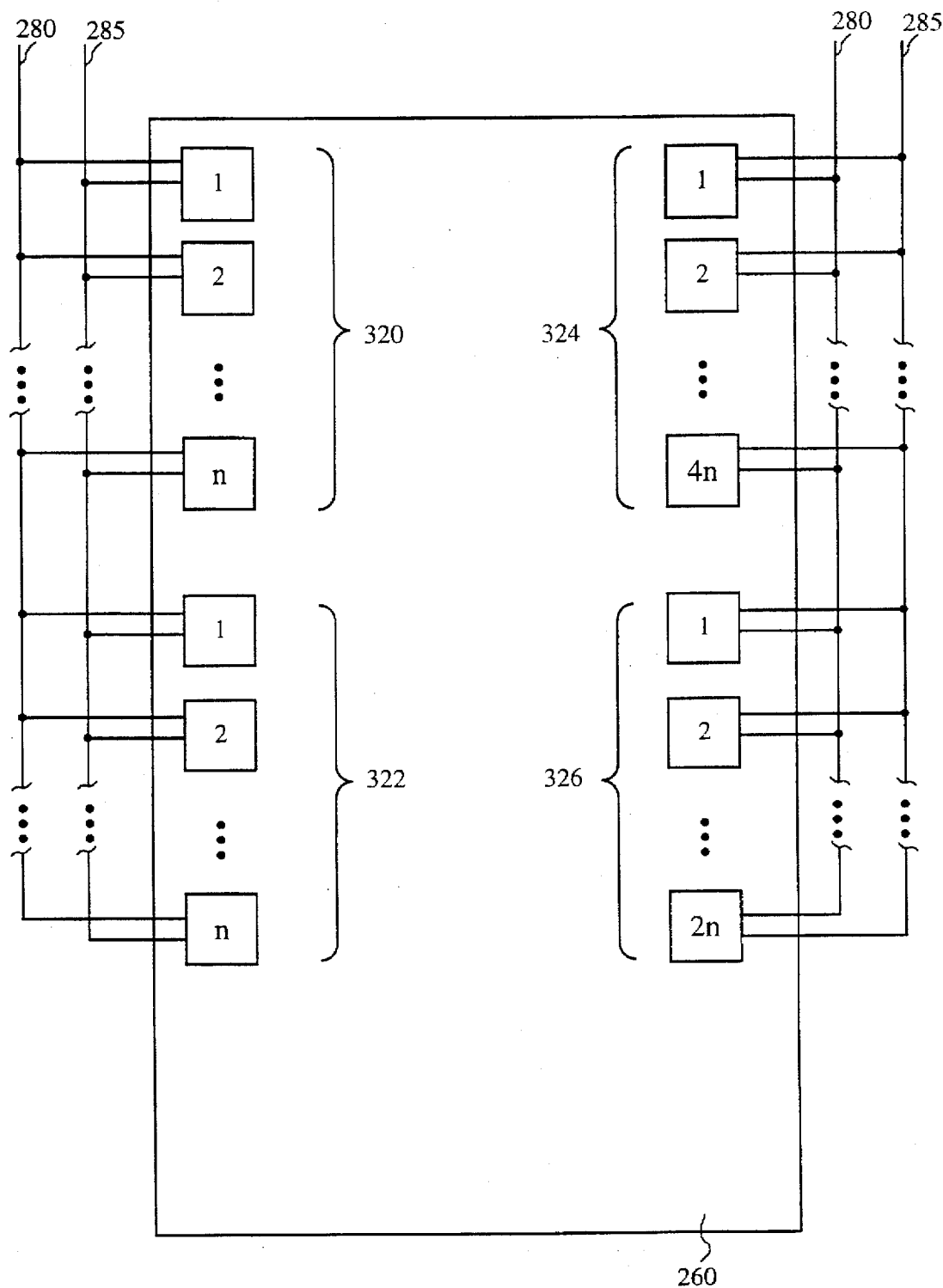
FIG. 5B is a block diagram of the read and write ports associated with the Global Interconnect Memory Unit of the present invention.

FIG. 5B illustrates the read and write port structure of GIMU 260 of the present invention. As discussed with reference to the interval control word 310, the GIMU 260 contains 4n read ports 324 for the 4 input signals to each of the n function generator modules 230 provided on data I/O bus 285. Each read port 324 is further coupled to address/control bus 280 for addressing and is also coupled to data I/O port 285. The GIMU 260 also contains 2n read ports 326 for providing signals to the flip-flop modules 240. Each read port 326 is coupled to address/control bus 280 for addressing and is also coupled to data I/O bus 285. Read ports 324 and 326 receive address information from field 310b of the interval control word 310. This structure allows each memory cell of the GIMU 260 to be shared (e.g., for receiving information) by each CLB of architecture 101.

GIMU 260 of FIG. 5B also contains n write ports 320, i.e. one write port for each function generator module 230, and n write ports 322, i.e. one write port for each flip-flop module 240. Each write port 320 and 322 is coupled to address/control bus 280 for addressing and is also coupled to data I/O bus 285 for information transfer (wherein each write port is coupled to the output terminal of a function generator module 230 or to the output terminal of a flip-flop module 240). Write ports 320 and 322 receive address information from field 310a of the interval control word 310. In an exemplary embodiment, the address/control bus 280 is large enough to supply a set of 11 address lines for each read and each write port 320 and 322. Data I/O bus 285 is large enough to supply a bit of information for each read port during the read cycle and a bit of information for each write port during the write cycle for each time interval. This structure allows each memory cell of the GIMU 260 to be shared (e.g., for storing information) by each CLB of architecture 101 as well as any I/O module (not shown).

In one embodiment, the memory cells of the GIMU 260 are located within a central unit (e.g., having 2048 locations in the array) and are shared by multiple CLBs over the data I/O bus 285 and the address/control bus 280. However, alternative embodiments of the present invention allow different memory cells of the GIMU 260 to be associated physically and logically with, or adjacent to, the function generators 230 and the flip-flop modules 240 that use the memory cells of the GIMU 260. In either implementation, the memory cells are fully addressable by any CLB and either implementation is considered within the scope of the present invention. It is appreciated that using the addressing structure described above, the addressing circuitry of the present invention required to supply signals to and store signals from the CLBs does not grow exponentially in size and complexity as the CLB array size grows.

V. STEPS OF EACH TIME INTERVAL

Figure 6:
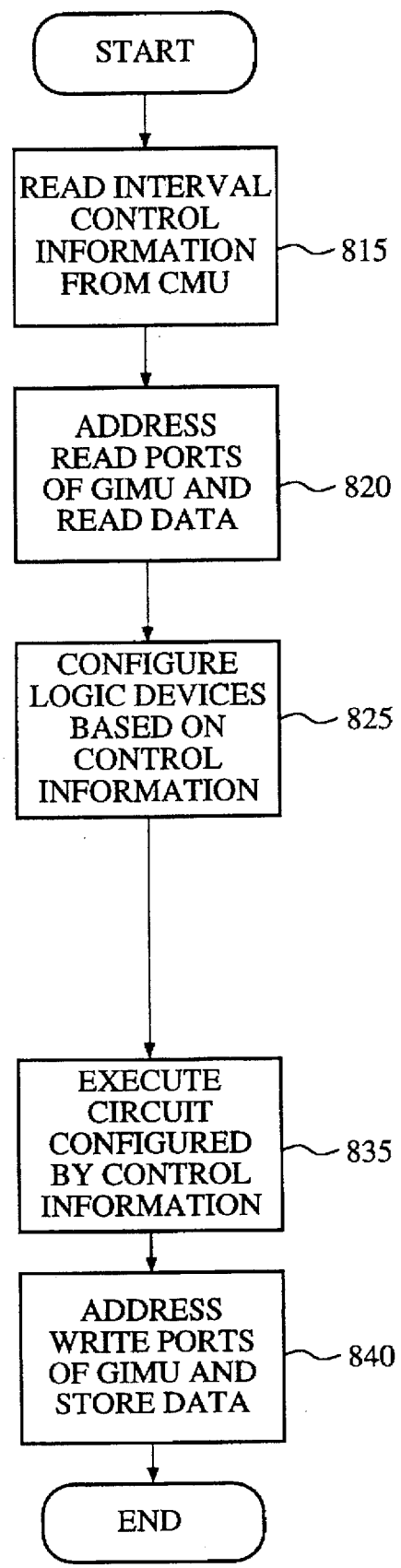
FIG. 6 is a flow chart illustrating steps performed by the present invention for each time interval.

FIG. 6 illustrates a flow diagram of the steps 810 performed by the present invention for each time interval. When operating at 100 MHz, process 810 is executed in approximately 10 nanoseconds. The process 810 starts at step 815 where the sequencer 220 addresses the CMU 210 (FIG. 3), thereby generating the interval control word 310 (FIG. 5A) for the exemplary time interval. During step 810, the interval control word is placed onto address/control bus 280. At step 820, the read cycle is performed. Read port information field 310b (FIG. 3) is accessed from bus 280 and the read addresses are used to address the read ports (324 and 326, FIG. 5B) of GIMU 260. The pertinent data is then transferred via data I/O bus 285 and supplied to the function generators 230, the flip-flop modules 240, and to the I/O modules 250. The FFMU 270 is also addressed by the sequencer 220 and read. During step 820, the FFMU 270 output data bits are supplied, individually, to each flip-flop module 240 via a dedicated connection for each flip-flop (see FIG. 8).

At step 825, the configuration data (e.g., information fields 310c–310f of the interval control word (FIG. 5A) is accessed from bus 280 and programmed into the function generators 230, the flip-flops modules 240, and to the I/O modules 250 so that the desired stage circuitry is realized by these logic modules for the exemplary time interval. Any of a number of well known methods, procedures and components used to program function generator 230 and flip-flop modules 240 can be used during step 825. It is appreciated that step 825 can occur simultaneously with step 820 or after step 820.

Before step 835, the stage circuitry for the exemplary time interval is realized. During step 835, the present invention applies the data read during step 820 to the logic circuitry configured at step 825. A separate output signal is generated by each function generator module 230 and by each flip-flop module 240 during step 835.

During step 840, the present invention uses the write addresses 310a (FIG. 5A) from bus 280 and accesses the write ports 320 and 322 of GIMU 260 (FIG. 5B), thereby allowing the output data generated during step 835 to be stored in the specified locations of GIMU 260 using data I/O bus 285. The FFMU 270 is also addressed by the sequencer 220 and the data bits from the flip-flop modules 240 are written to FFHU 270 during step 840 (utilizing dedicated signal lines for each flip-flop module 240). Also at step 840, the contents of the CMU 210 and the GIMU 260 can be written to from an external or an internal source. After step 840, the exemplary time interval is complete and a new time interval is sequenced in by sequencer 220.

By writing data into the GIMU 260 at the completion of a time interval and reading the data at the start of the time interval, the present invention allows data produced by one logic module (e.g., a function generator 230 or flip-flop 240 module) to be used by the same logic module, or another, in a subsequent time interval. In accordance with the present invention, a logic module can be re-configured to perform different logic functions for different time intervals. In this way, a single logic module can be used in different stages of a circuit using multiple time intervals to create a number of virtual gates.

VI. EXEMPLARY VIRTUAL GATE CAPACITY

In an exemplary embodiment, the CMU 210 contains 2048 interval control words supporting 2048 time intervals per logic cycle. If the duration of a time interval is 10 nanoseconds (100 MHz), then the CMU 210 accesses all interval control words in a total of 20.48 µs. If the interval control words are 2048 bits long, this implementation is sufficient to configure 20 function generator modules 230, 20 flip-flop modules 240, and supply all the address bits needed for the read and write ports of the GIMU 260. Assuming there are 6 gates equivalent per function generator module 230 and 8 gates equivalent per flip-flop module 240, this implementation offers up to 280 gates per time interval assuming n=20. Given 2,048 time intervals times 280 gates per time interval, the present invention provides 573,440 virtual gates per logic cycle at roughly a 50 kHz rate, thereby providing the equivalent of 28,672,000,000 gates per second. If a logic cycle is limited to 100 time intervals, then 28,000 virtual gates can be used per logic cycle, and would operate at roughly 1 MHz rate.

VII. DESIGN FLEXIBILITY OF ARCHITECTURE 101

Logic Cycle Duration. In accordance with the present invention, the number of circuit stages (e.g., time intervals) used to realize a circuit is variable. For instance, the more circuit stages used, the more time intervals are consumed to realize the circuit and the slower the circuit operates. If fewer stages are used, the circuit is reduced in complexity but operates at a higher rate. According to the present invention, the circuit designer has flexibility to program the number of time intervals per logic cycle by programming the CMU 210 appropriately or by programming the sequencer 220. In one embodiment of the present invention, since the CMU 210 contains 2048 addressable locations, the maximum number of time intervals per logic cycle is 2048 and the minimum number of time intervals per cycle is 1. By programming the sequencer 220 to reset appropriately, the user can effect any number of time intervals within a logic cycle from 1 to 2048. If the average time for a logic cycle is 50 kHz, then the exemplary embodiment of the invention may provide 573,440 virtual gates as discussed above. However, if the average period for a logic cycle is desired to be faster such that 500 kHz are provided, then the preferred embodiment of the invention provides only 57,344 virtual gates.

Time Interval Duration. The architecture 101 of the present invention can be optimized such that the number of logic modules and the memory size are chosen to implement the desired function in the most efficient manner. Such factors as speed and density are variables that can be optimized (by programming the CMU 210) when implementing a logic design using the present invention. The above optimizations are programmable within the CMU 210.

Adaptive Programming. Logic modules (e.g., function generator modules 230 or flip-flop modules 240) or I/O modules 250 can write directly to the CMU 210. Because the logic elements of function generator modules 230 and flip-flop modules 240 are redefined for each time interval, it is possible to alter the CMU 210 of the present invention based upon the results obtained during a logic cycle, such that the subsequent logic cycles implement different logic functions. In this manner, the present invention is adaptive and the logic function ultimately accomplished by the architecture 101 can be modified over time to adapt to states determined by the various logic blocks and flip-flops discussed.

Flexible Routing. In accordance with the present invention, signals are routed between the logic modules (e.g., function generator modules 230 and/or flip-flop modules 240) due to the flexible routing provided by the memory cell addressing of the GIMU 260. Because routing occurs in the GIMU 260, any signal in the circuit architecture 101 can be propagated to any other logic module within the circuit architecture 101 via the GIMU 260.

VIII. LOGIC MODULE DESIGN

Figure 7:
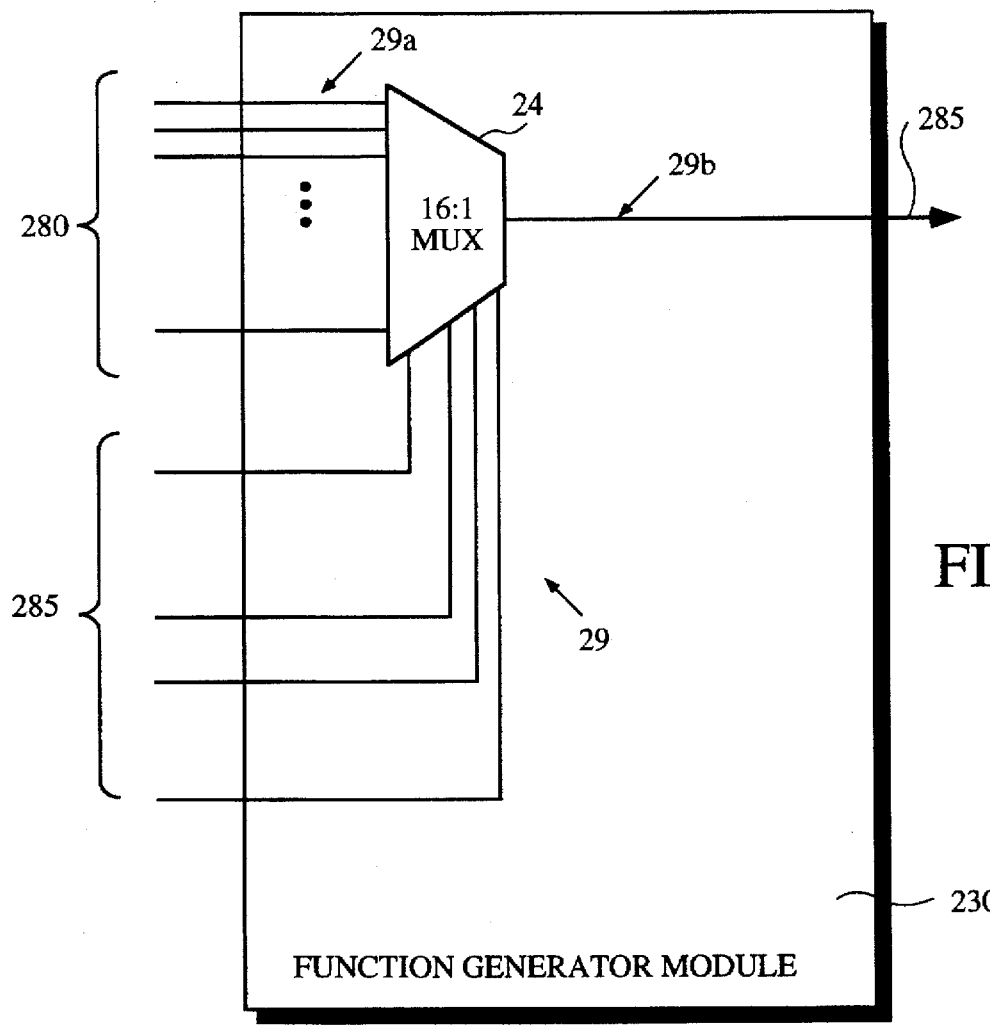
FIG. 7 is a block diagram of a configurable function generator module realized in accordance with the present invention.

FIG. 7 is a block diagram of a function generator module 230 used in the present invention. It should be appreciated that other logic modules may also be used with the invention. The function generator module 230 includes a multiplexer 24 which, in this example, is a 16:1 multiplexer. The multiplexer 24 is controlled by a plurality of select lines 29 that originate from data/IO bus 285. In the case of a 16:1 multiplexer, four select lines 29 from bus 285 are used. The operation of multiplexer 24 to implement logic functions is known in the art and therefore not described in detail herein.

In one embodiment of the present invention, the signals over select lines 29 are the data input signals to the function generator 230 and originate from four separate read ports (e.g., ports 324 of FIG. 5B) of the GIMU 260.

The function generator module 230 of FIG. 7 receives configuration data (e.g., 16 83 bits) from CMU 210 via sixteen signal lines 29a of address/control bus 280. Specifically, signal lines 29a receive information from field 310c of the interval control word (FIG. 5A) wherein the signals on lines 29a represent the function to be performed by function generator 230. Function generator 230 generates an output signal 29b which is carried over data I/O bus 285 back to a write port (e.g., port 320 of FIG. 5B) of GIMU 260 where the signal can be stored for use by any subsequent time interval.

This configuration is provided for each of the n function generators 230. As described with respect to FIG. 6, at the beginning of a time interval, the CMU 210 is used to configure the function generator 230, while the GIMU 260 supplies the required data over data I/O bus 285. At the end of the time interval, the output signal of the function generator 230 can be saved in the GIMU 260 via bus 285.

Figure 8:
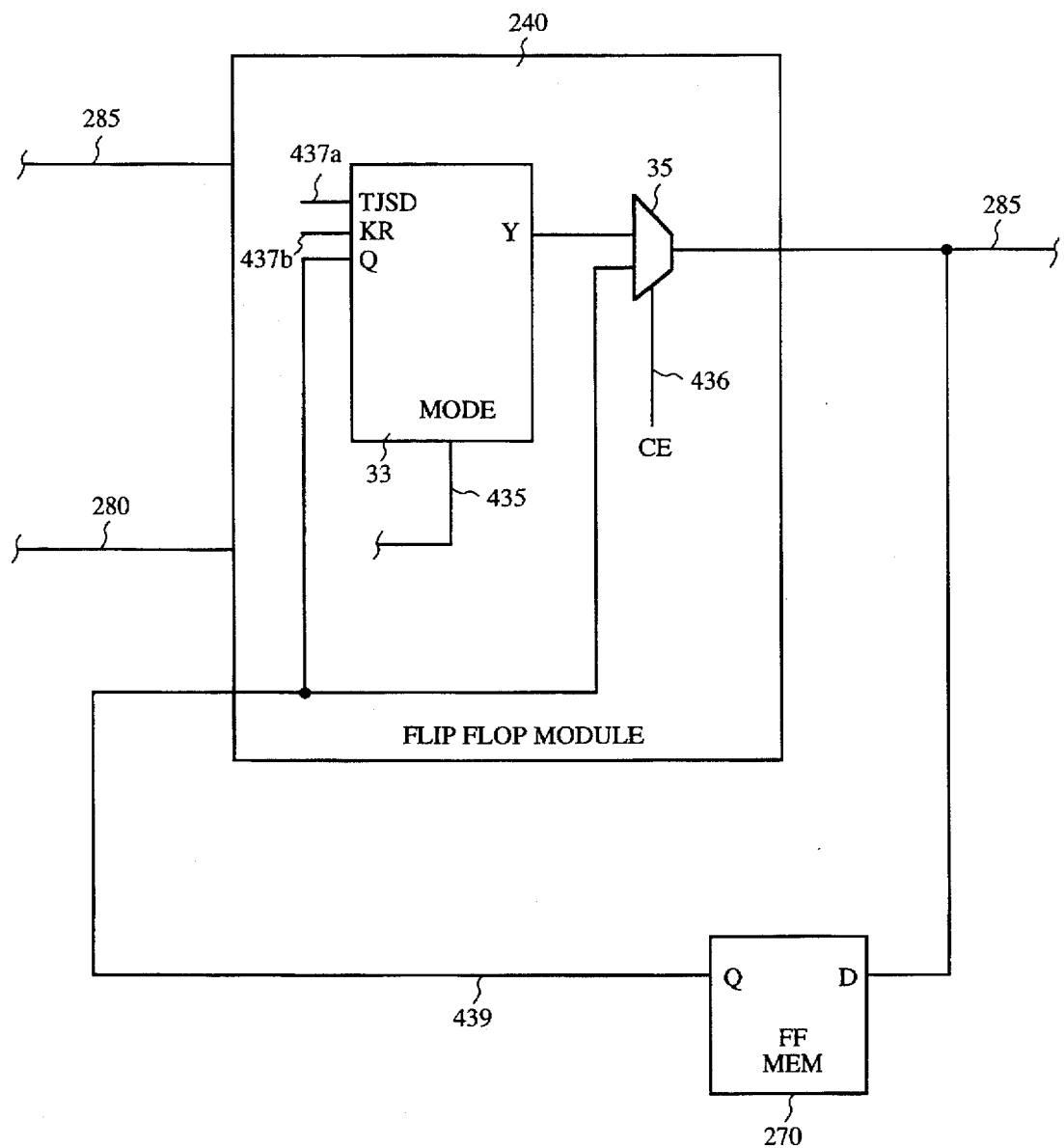
FIG. 8 is a block diagram of a configurable flip-flop module in conjunction with the Flip-Flop Memory Unit of the present invention.

FIG. 8 is a block diagram of a flip-flop module 240 and an associated FFMU 270 of the present invention. Signals from any previous time interval can be provided to the input of the flip-flop module 240 over the data I/O bus 285 by a read port (e.g., a port 326 of FIG. 5B) of the GIMU 260. The output signal of multiplexer 35 can also be stored to a write port within GIMU 260 via data bus 285. In an alternative embodiment, memory cells of the GIMU 260 can be associated as part of flip-flop module 240.

There are separate data input lines 437a and 437b for each flip-flop module 240. Input line 437a provides a T, J, S, or D input signal and is coupled to bus 285 as well as to a circuit 33. The internal circuitry of circuit 33 that realizes the above multiple flip-flop circuit types is described in U.S. Pat. No. 5,410,194 by Freidin and is incorporated herein by reference. Similarly, input line 437b provides a K or R input signal and is coupled to data I/O bus 285 as well as to circuit 33. Between the two input lines 437a and 437b, input signals for JK, SR, T, or D flip flops are provided to circuit 33 from bus 285. Line 439, which provides output signals from FFMU 270, is also coupled to circuit 33.

Circuit 33 of the present invention contains circuitry to realize a JK, SR, T, or D flip-flop depending on the mode selection signal carried over line 435. Line 435 is coupled to address/control bus 280 as well as to circuit 33. The mode of the flip-flop module 240 is programmable during each time interval. The CMU 210 controls the type of flip-flop function that is to be implemented (e.g., JK, SR, T, D) by issuing mode data over the line 435 of the address/control bus 280. The mode data originates from field 310d of the interval control word (FIG. 5A).

The Y output terminal of circuit 33 is coupled to a multiplexer 35 having an output terminal coupled to bus 285 as well as to the input terminal of FFMU 270. The output terminal of FFMU 270 is coupled to multiplexer 35 via line 439 for retaining data when the clock is disabled by deasserting clock enable (CE) signal on line 436. If the CE signal on control line 436 is asserted, multiplexer 35 selects and passes the Y output signal from circuit 33. In contrast, if the CE signal on control line 436 is not asserted (e.g. clock disabled), multiplexer 35 selects and passes the signal on line 439. The control line 436 is provided by bus 285.

FFMU 270 saves states and conditions that are generated during the operation of a flip-flop module 240. Thus, a value produced by a flip-flop module 240 during a particular time interval can be written to and then read from the FFMU 270 one logic cycle later. Because FFMU 270 receives the output signal Y from circuit 33 during one time interval and holds the signal until the next logic cycle, FFMU 270 acts as a D flip-flop clocked by the logic cycle period. FFMU 270 contains one bit of data storage for each flip-flop module 240 for each time interval.

Thus, the output signal Q, of FFMU 270 is provided at the subsequent logic cycle from when the data was stored. By configuring circuit 33, the flip-flop module 240 of the present invention, in conjunction with the virtual D flip-flop emulated by FFMU 270, can realize a T flip-flop, a JK flip-flop, an SR flip-flop, or a D flip-flop. It is appreciated that the FFMU 270 is required to effectively emulate the flip-flops because Y output data stored in the GIMU 260 (e.g. over line 285) can be overwritten between logic cycles which is prevented by the FFMU 270.

IX. INPUT/OUTPUT MODULE DESIGN

Figure 9A:
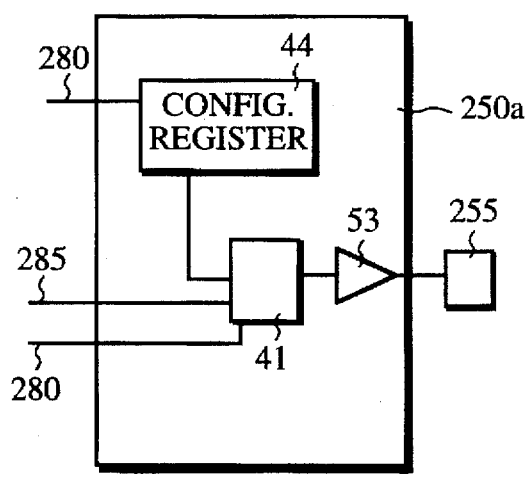
FIG. 9A is a block diagram of a configurable output module in accordance with the present invention.

Output Modules. FIG. 9A is a block diagram of an output module 250a according to the present invention. The output module 250a contains a programmable configuration register 44 that receives data signals from the address/control bus 280 and stores an address represented by the data signals. The configuration register 44 holds the specified address (of the GIMU 260) which is compared by a write detect block 41 against addresses seen over a portion of the address/control bus 280. Block 41 also receives data from the data I/O bus 285, and detects when this data is written to the GIMU 260 (FIG. 3) at the specified address in the configuration register 44. When a match occurs, a copy of the data in that specified address of the GIMU 260 is transferred to block 41 over data I/O bus 285, and is driven over output pad 255 by driver 53. Any location in the GIMU 260 can also be an output signal according to configurable I/O module 250a.

Figure 9B:
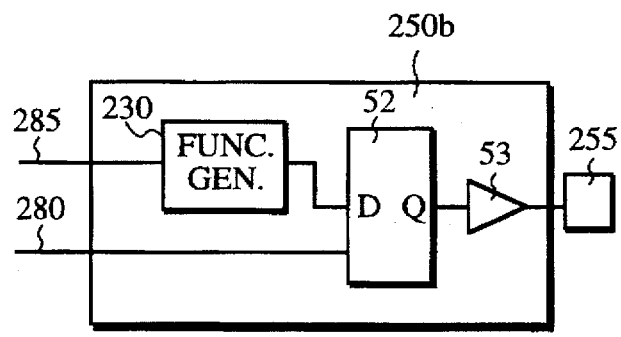
FIG. 9B is a block diagram of a configurable output module of the present invention having an associated configurable function generator.

FIG. 9B is a block diagram of an output module 250b according to the present invention. Module 250b includes a function generator module 230 which receives input signals over bus 285 from GIMU 260. The CMU 210 (FIG. 2) provides an enable signal over a signal line of address/control bus 280 (from field 310e of interval control word 310) to a flip-flop 52 (in one embodiment, flip-flop 52 is a D-type flip-flop). The data signal produced by the function generator 230 is latched in the flip-flop 52 and driven through a buffer 53 to an output pad 255.

Figure 9C:
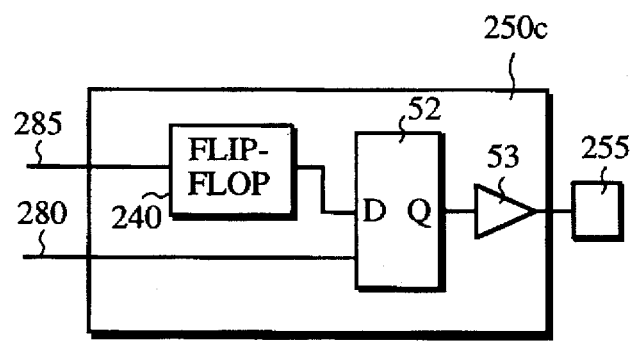
FIG. 9C is a block diagram of a configurable output module of the present invention having an associated configurable flip-flop.

FIG. 9C is a block diagram of an output module 250c in accordance with the present invention. Module 250c is similar to module 250b, but includes a flip-flop module 240 (in lieu of a function generator module 230) coupled to bus 285. A value produced by the flip-flop module 240 is provided to a D flip-flop 52, which upon receiving an enable signal from the CMU 210, produces an output signal that is driven through a buffer 53 to an output pad 255. The CMU 210 provides the enable signal over a signal line of address/control bus 280 (from field 310e of interval control word 310).

Figure 9D:
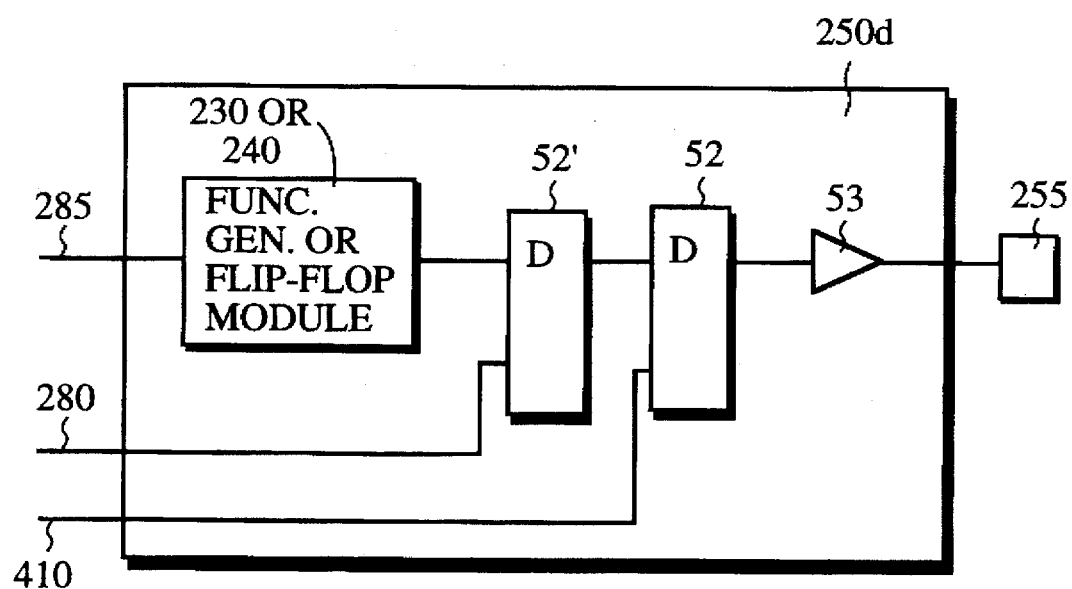
FIG. 9D is a block diagram of a configurable output module of the present invention having associated dual configurable flip-flop and configurable function generator modules.

FIG. 9D is a block diagram of an output module 250d of the present invention and contains either a function generator module 230 or a flip-flop module 240 coupled to bus 285. Module 250d receives an enable signal over bus 280 from the CMU 210. The enable signal (originating from field 310e of interval control word 310) is input to the clocked input terminal of a first D-type flip-flop 52' to latch the output signal from function generator module 230 or from flip-flop module 240. A second signal, a synchronization signal over line 410, is coupled to the clock terminal of a second D-type flip-flop 52. The second flip-flop 52 receives the output signal of the first flip-flop 52' and, when clocked, provides a signal that is driven by buffer 53 to an output pad 255. The addition of the synchronization flip-flop 52 allows synchronous presentation of multiple output block changes, even if the change did not occur in synchronization with clock 410. Note that any of the I/O modules 250a, 250b, 250c and 250d can be located within I/O module 250 (FIG. 3).

Figure 10A:
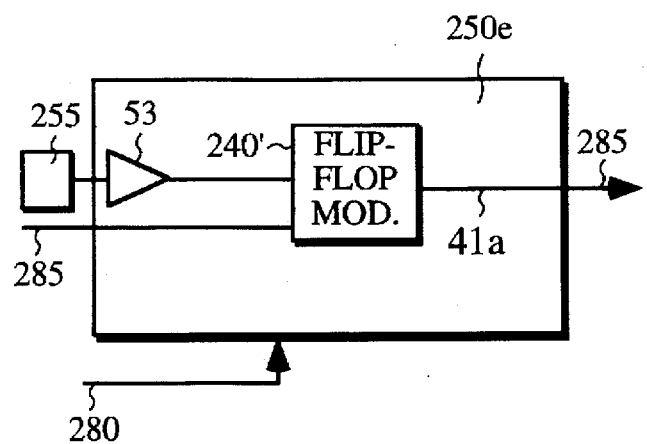
FIG. 10A is a block diagram of an input module in accordance with the present invention having an associated configurable flip-flop module.

Input Modules. FIG. 10A is a block diagram of an input module 250e according to the present invention. The input module 250e includes an input pad 255 that receives an external signal which in turn is driven over buffer 53 to a flip-flop module 240'. The mode of the flip-flop module 240' is determined by a configuration signal from the CMU 210 over address/control bus 280 from field 310d of the interval control word 310. Flip-flop module 240 also receives an enable signal over bus 285 from the GIMU 260. The I/O module 250e provides an output value over line 41a to a signal line of data I/O bus 285 which is coupled in turn to a write port of GIMU 260.

Figure 10B:
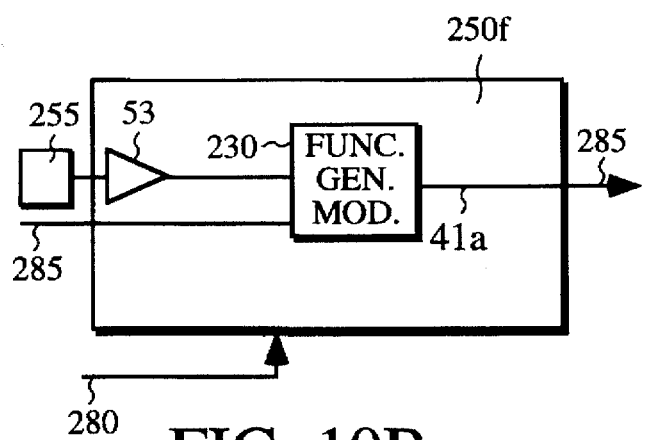
FIG. 10B is a block diagram of an input module in accordance with the present invention having an associated configurable function generator module.

FIG. 10B is a block diagram of an input module 250f associated with a function generator module 230 module according to the present invention. An external signal received at pad 255 is driven by buffer 53 to an input terminal of function generator module 230. The function generator module 230 is configured by field 310c of the interval control word 310 output from CMU over bus 280. The input data to be processed by the function generator module is provided by either the GIMU 260 over bus 285 or from the input pad 255 or from both. The signal over line 41a produced by function generator module 230 is supplied over a data line of data I/O bus 285.

Figure 10C:
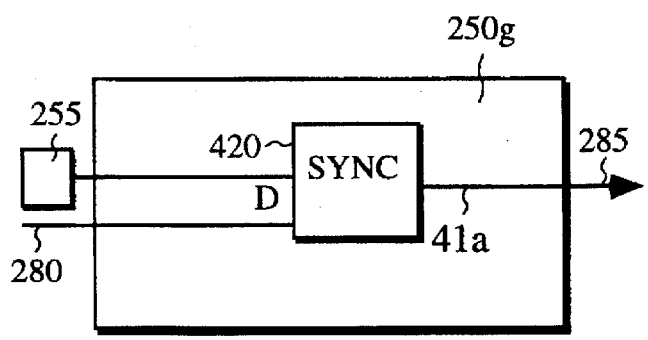
FIG. 10C is a block diagram of an input module in accordance with the present invention having an associated synchronization flip-flop module.

FIG. 10C is a block diagram of an input module 250g associated with a synchronization flip-flop module 420 of the present invention. A synchronization flip-flop 420 receives an external signal from an input pad 255. The synchronization flip-flop 420 receives an enable signal from field 310e of the interval control word 310 provided by CMU 210 over address/control bus 280, and provides the output signal on line 41a over data I/O bus 285 to GIMU 260. Multiple input modules 250g are used for receiving data on multiple input pins 255 at the same time, even though the signals are used during different time intervals. Note that any of the I/O modules 250e, 250f, and 250g can be located within I/O module 250 (FIG. 3).

X. VIRTUAL PARTITIONING AND GIMU STORAGE PER TIME INTERVAL

The architecture 101 of the present invention also allows virtual circuit partitioning such that individual virtual partitions are defined by a set of virtual gates that realize different circuits each having different numbers of time intervals (e.g., different numbers of stages) and/or different time interval durations and operate at different frequencies. For instance, using virtual partitioning, the present invention allows a first circuit partition to operate at faster frequencies with fewer time intervals in which to realize all circuit stages and therefore having a less complex overall circuit (e.g. composed of less circuit stages). A second partition of the IC can operate at slower frequencies, having more time intervals to realize all circuit stages but having a more complex overall circuit (e.g., composed of more circuit stages). Assuming the first partition contains 5 time intervals (e.g., 5 circuit stages) and assuming the second partition has 15 time intervals (e.g., 15 circuit stages), and assuming the logic cycle duration is 15 time intervals, the gates of the first partition will execute three times during one logic cycle while the gates of the second partition execute only once. The extent partitioning is performed within architecture 101 depends on the program of interval control words 310 stored in CMU 210.

Figures 11A, 11B:
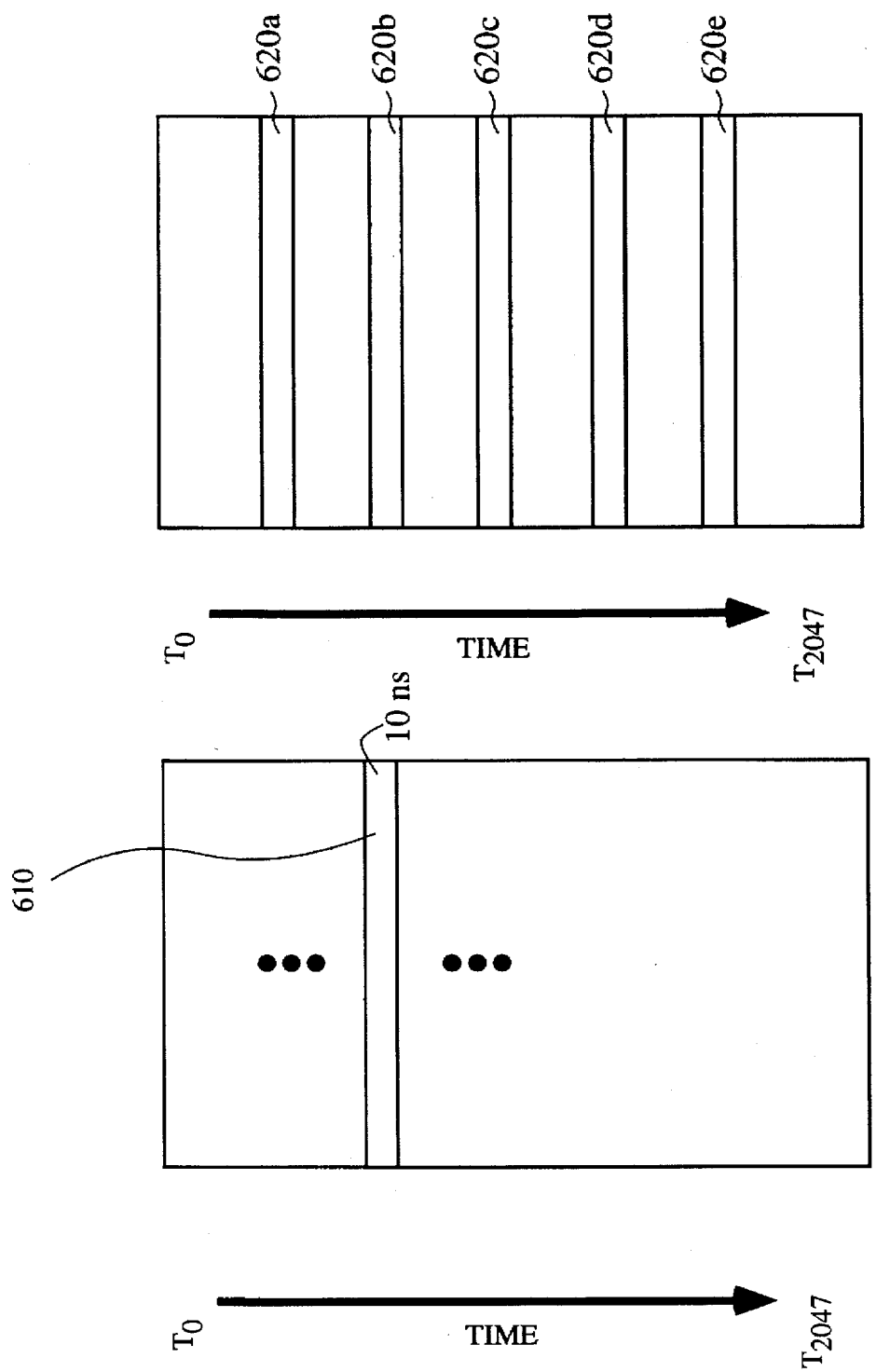
FIG. 11A is a representation of an entire logic cycle illustrating an individual time interval therein.
FIG. 11B is a logic diagram of a logic cycle according to the present invention showing a multiple repeated single time interval and a series of time intervals having no repetitions.

FIG. 11A is a logical timing diagram of an architecture having no virtual partitions. FIG. 11A shows a logic cycle having a series of equal time intervals (0 to 2047), in which each time interval 610 has an exemplary duration of 10 nanoseconds. In this manner, an exemplary 50 kHz frequency is provided. In this example, the sequencer 220 (FIG. 3) operates at 100 MHz and 2048 words contained in the CMU 210 (FIG. 3) provide 2048 time intervals for the logic cycle. A circuit can be realized having 2048 stages and would process input at an exemplary frequency of 50 kHz. Accordingly, each gate of architecture 101 can be used 2048 times during the logic cycle. Of course, the logic cycle can be smaller by taking fewer time intervals to complete.

FIG. 11B is a logical representation of a logic cycle of one type of virtual partitioning assuming a sequencer frequency of 100 MHz. FIG. 11B illustrates a logic cycle having a set of repeated logic functions according to the present invention where a number of virtual gates operate at one effective frequency while other virtual gates operate at a slower frequency. Operating at the faster frequency, a set of evenly-spaced single time intervals 620a–620e are shown in which a total of 50 nanoseconds is provided per logic cycle which consists of 5 intervals (620a–620e) at 10 nanoseconds each. In this example, the same set of gates (e.g., re-configured and reused within intervals 620a–620e) is utilized five times during the logic cycle, thereby operating at an effective frequency of 250 kHz (e.g., 5×50 kHz). The remainder of the time intervals are not repeated and operate at a slower frequency of 50 kHz.

Assuming n=20, there are 280 gates per time interval and roughly 573 k virtual gates per logic cycle (280×2048) total. In the example of FIG. 11B, roughly 1400 (280×5) virtual gates are used to implement 280 gates that operate at 250 kHz while the rest of the virtual gates operate at 50 kHz.

Figure 12A:
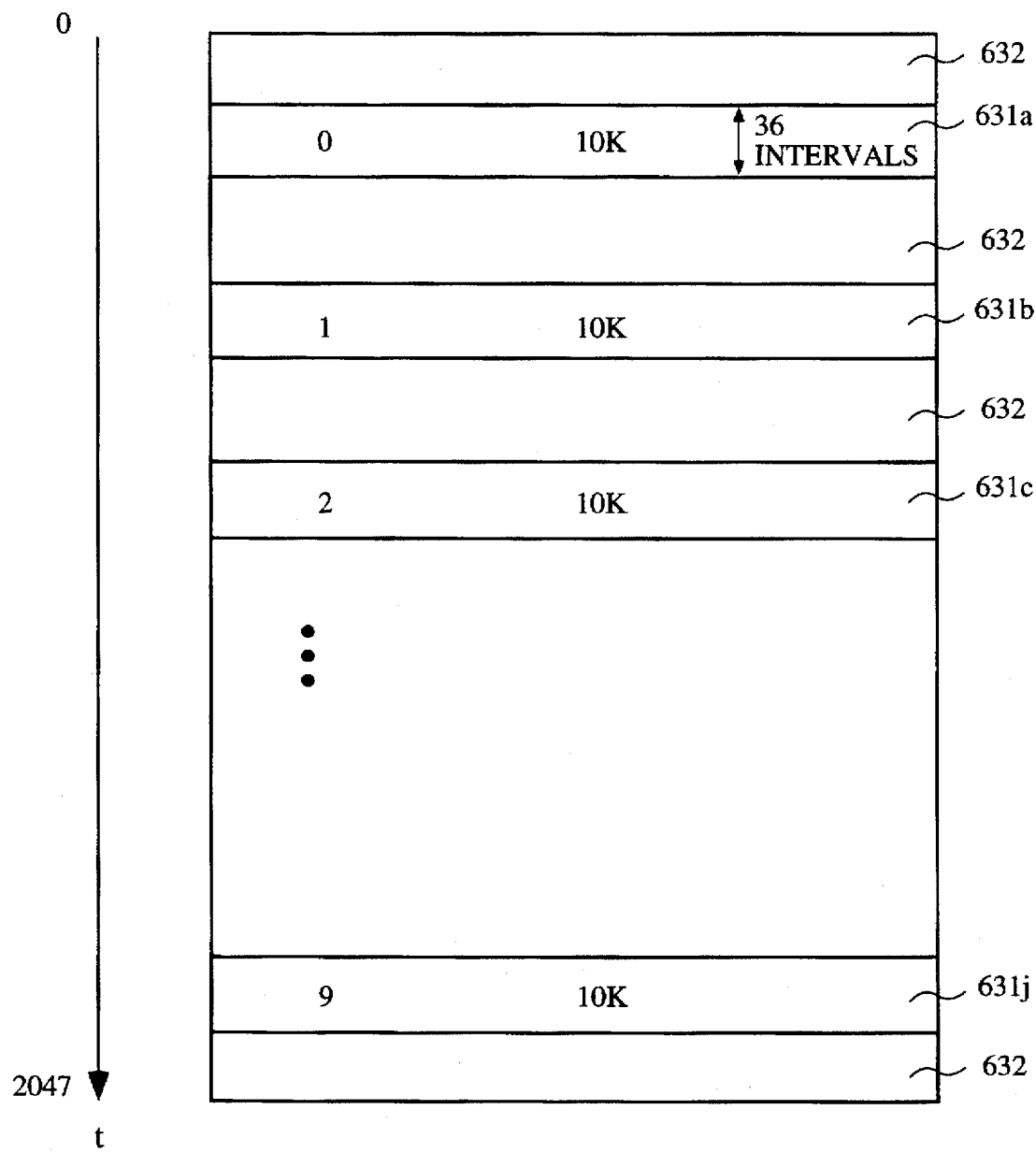
FIG. 12A is a logic diagram of a logic cycle according to the present invention showing a multiple repeated set of time intervals (e.g., 36) and a series of time intervals having no repetitions.

FIG. 12A is a logical representation of a logic cycle of the present invention having a series of time interval sets 631a–631j repeated 10 times (0–9) over the logic cycle (2048 time intervals). Within each time interval set 631a–631j there are 36 time intervals. Therefore, each set 631a–631j contains 280×36 or roughly 10 k virtual gates. Since there are 10 sets (631a–631j), the virtual circuitry associated with the repeated sets 631a–631j consumes roughly 100 k virtual gates and operates at a frequency of 10×50 kHz or 500 kHz assuming a sequencer 220 frequency of 100 MHz. The rest of the virtual circuitry 632 is not repeated and provides 470 k virtual gates (e.g., 570 k–100 k) and operates at a rate of 50 kHz. The partitioning shown in FIG. 12A is programmable within the interval control words 310 of CMU 210.

Figure 12B:
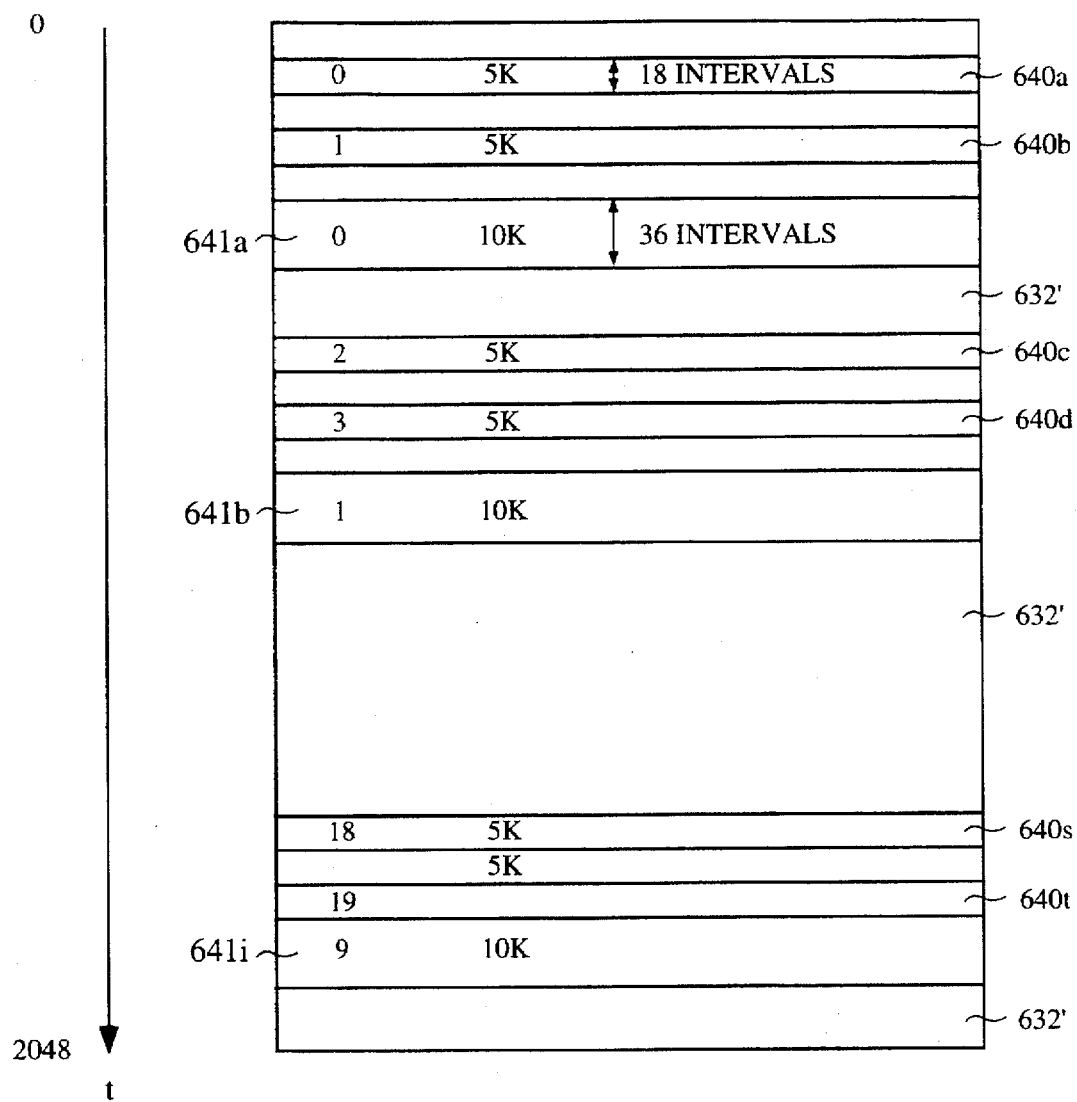
FIG. 12B is a logic diagram of a logic cycle according to the present invention showing a first multiple repeated set of time intervals e.g., 36), a second multiple repeated set of time intervals e.g., 16) and a series of time intervals having no repetitions.

FIG. 12B is a logical representation of a logic cycle of the present invention having three virtual partitions. FIG. 12B shows a series of time interval sets 641a–641j repeated 10 times (0–9) over a logic cycle (2048 time intervals) and a series of time interval sets 640a–640t repeated 20 times (0–19) over the same logic cycle. Within each set 641a–641j there are 36 time intervals. Therefore, each set 641a–641j contains 280×36 or roughly 10 k virtual gates. Since there are 10 sets (641a–641j), the virtual circuitry associated with sets 641a–641j consumes roughly 100 k virtual gates and operates at a frequency of 10×50 kHz or 500 kHz assuming a sequencer 220 frequency of 100 MHz.

Within each set of time intervals 640a–640t of FIG. 12B there are 18 time intervals. Therefore, each set 640a–640t contains 280×18 or roughly 5 k virtual gates. Since there are 20 sets (640a–640t), the virtual circuitry associated with sets 640a–640t consumes roughly 100 k virtual gates and operates at a frequency of 20×50 kHz or 1000 kHz assuming a sequencer 220 frequency of 100 MHz. The remainder of the virtual circuitry 632' is not repeated and provides 370 k virtual gates (e.g., 570 k-100 k-100 k) and operates at a frequency of 50 kHz. The partitioning shown in FIG. 12B is programmable within the interval control words 310 of CMU 210.

Figure 13:
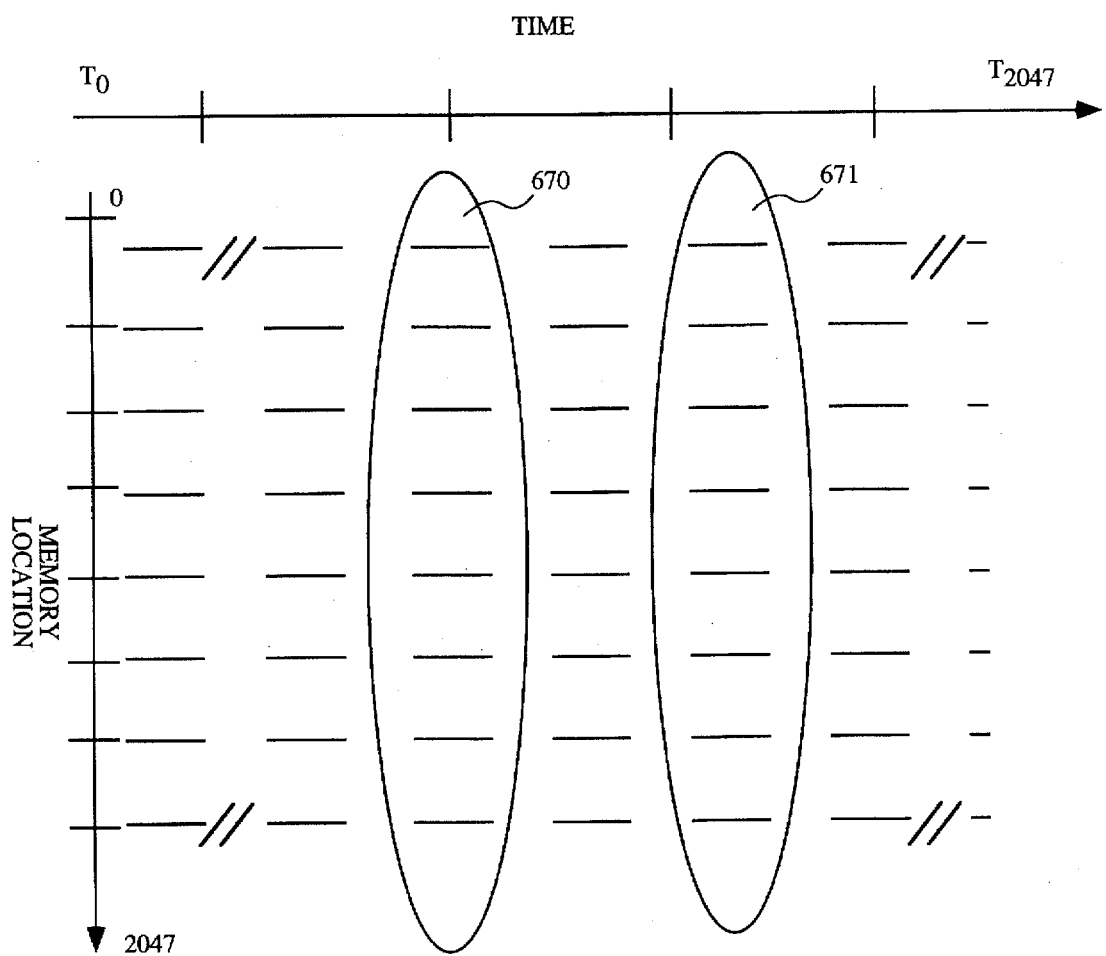
FIG. 13 is a diagram illustrating available memory locations of the Global Interconnect Memory Unit along the vertical versus individual time intervals along the horizontal in accordance with the present invention.

FIG. 13 is a timing diagram of GIMU 260 memory locations along the vertical axis and time intervals shown along the horizontal axis. The columns refer to the use of the memory locations of the GIMU 260 for each time interval. The circled time interval 670 is an example of the 2048 bits that can be accessed during an exemplary time interval. At any given time in this example, up to 2n writes can take place into the GIMU 260 and up to 5n reads can take place.

A bit of memory in the GIMU 260 functions like a signal line. Writing to a bit to the GIMU 260 is equivalent to placing a signal on a line. Reading a bit of the GIMU 260 and passing the value to a logic module (e.g., flip-flop module 240, or function generator 230) is equivalent to connecting a line to the module. If a specific location in the GIMU 260 is written only once per cycle, then that memory location only represents one signal. If a location is written to more than once per cycle, then the location can represent multiple signals, however each signal remains valid until it is overwritten.

The second circled portion 671 of FIG. 13 illustrates potential access of any of the same 2048 bits of GIMU 260 at a subsequent time interval. The CMU 210 controls all information access from the GIMU 260 between time intervals. If the CMU 210 for a given time interval does not write to a given location, then the data for that location is available for subsequent time intervals.

The present invention uses circuitry to program a complement of logic modules and interconnect structure to implement individual stages of a complex logic circuit (over individual time intervals) such that for each time interval, the logic and interconnect are reprogrammed to implement an individual circuit stage associated with the time interval, and further, information required between circuit stages is stored in memory units. While the present invention has been described in particular embodiments, it should be appreciated that the present invention should not be construed as limited by such embodiments, but rather construed according to the below claims.

What is claimed is:

1. A programmable integrated circuit comprising:
  a plurality of programmable logic modules coupled to a configuration bus to receive programming information wherein said programming information is for configuring each of said plurality of programmable logic modules to perform a specified function;
  a first memory coupled to said configuration bus for containing a plurality of programming information used to program said plurality of programmable logic modules, wherein said first memory is for supplying said plurality of programming information over a plurality of time intervals to said plurality of programmable logic modules wherein, for each of said plurality of time intervals, each of said plurality of programmable logic modules can be programmed to perform a specified function based on a programming information; and
  a second memory for storing results of said plurality of programmable logic modules generated at a completion of a time interval and for supplying input signals for said plurality of programmable logic modules at a start of a time interval, said second memory comprising individual memory cells that are shared for receiving results from different programmable logic modules over a plurality of time intervals.

2. A programmable integrated circuit as described in claim 1 wherein said second memory comprises a read port and a write port for each programmable logic module, and wherein said second memory is coupled to and addressed by said configuration bus.

3. A programmable integrated circuit as described in claim 2 wherein each programming information of said plurality of programming information comprises:
  configuration information to configure said plurality of logic modules for a time interval; and
  read and write addressing information for addressing said read and write ports of said second memory for said time interval.

4. A programmable integrated circuit as described in claim 3 further comprising a sequencer circuit coupled to address said first memory at each time interval with addressing signals and wherein said plurality of programming information comprise a sequence of interval control words, one interval control word associated with each time interval.

5. A programmable integrated circuit as described in claim 3 further comprising:
  a data bus coupled to said plurality of programmable logic modules and coupled to said second memory wherein said data bus supplies said results to said second memory and wherein said data bus supplies said input signals to said plurality of programmable logic modules from said second memory.

6. A programmable integrated circuit as described in claim 3 wherein said plurality of programmable logic modules further comprises:
  a plurality of programmable function generator circuits having multiple inputs; and
  a plurality of programmable flip-flop circuits.

7. A programmable integrated circuit as described in claim 3 wherein a logic cycle comprises a plurality of time intervals and wherein, for each time interval, said first memory programs said plurality of programmable logic modules to realize a separate circuit stage of a circuit and wherein said circuit is realized within said logic cycle.

8. A field programmable gate array having virtual gate capacity, said field programmable gate array comprising:
  a plurality of programmable logic modules coupled to an address/control bus to receive programming information wherein said programming information configures each of said plurality of logic modules to perform a specified function;
  a configuration memory coupled to said address/control bus for containing a sequence of programming information for programming said plurality of programmable logic modules to perform logic functions, said configuration memory for sequentially programming said logic functions over individual time intervals to perform specified logic functions for each time interval, said configuration memory also for generating address signals from said programming information over said address/control bus; and
  an information storage memory for storing results of said plurality of programmable logic modules generated at a completion of a time interval and for supplying input signals to said plurality of programmable logic modules at a start of a time interval, said information storage memory coupled to and addressed by said configuration memory and comprising:
    individual memory cells for receiving results from different programmable logic modules over a plurality of time intervals; and
    a read port and a write port for each of said plurality of programmable logic modules.

9. A field programmable gate array as described in claim 8 wherein each programming information comprises:
  configuration information to configure said plurality of programmable logic modules for a time interval; and read and write addressing information for addressing said read and write ports of said information storage memory for said time interval, wherein each read port and each write port are separately addressed by said configuration memory.

10. A field programmable gate array as described in claim 9 wherein said sequence of programming information comprises a plurality of words, each of said plurality of words containing programming information for an individual time interval and wherein said configuration memory is addressed by a sequencer to present at least one word of said plurality of words over said address/control bus for each time interval.

11. A field programmable gate array as described in claim 9 wherein said plurality of programmable logic modules further comprises:
   a plurality of programmable function generator circuits each having multiple inputs;
   a plurality of programmable flip-flop circuits; and
   a plurality of programmable I/O modules coupled to integrated circuit pads.

12. A field programmable gate array as described in claim 9 further comprising a data I/O bus coupled to said information storage memory and coupled to each of said plurality of programmable logic modules.

13. A field programmable gate array as described in claim 9 further comprising an access port for allowing programming information to be externally loaded into said configuration memory.

14. A field programmable gate array as described in claim 13 wherein said access port is also for allowing programming information to be internally loaded into said configuration memory.

15. A field programmable gate array as described in claim 9 wherein a logic cycle comprises a plurality of time intervals and wherein said configuration memory programs said plurality of programmable logic modules to realize, within each time interval, a separate circuit stage of a circuit and wherein said circuit is realized within said logic cycle.

16. A field programmable gate array having virtual gate capacity, said field programmable gate array comprising:
   a plurality of programmable logic modules coupled to an address/control bus to receive programming information to configure each of said plurality of programmable logic modules to perform a specified function;
   a configuration memory coupled to said address/control bus for containing a plurality of program words for programming said plurality of programmable logic modules to perform logic functions over a plurality of time intervals, each of said plurality of program words for programming said programmable logic modules for an individual time interval to perform specified logic functions, each of said plurality of program words also containing address information; and
   an information storage memory coupled to a data I/O bus for storing results of said plurality of programmable logic modules generated at a completion of a discrete time interval and coupled to said address/control bus, said information storage memory for supplying input signals to said plurality of programmable logic modules during a start of a discrete time interval, said information storage memory comprising:
      individual memory cells for receiving results from different programmable logic modules over a plurality of time intervals; and
      a separate read and write port for each programmable logic module, said separate read and write port addressed by said address information.

17. A field programmable gate array as described in claim 16 wherein each programming word comprises:
   configuration information to configure said plurality of programmable logic modules for a time interval; and
   read and write addressing information for addressing said read and write ports of said information storage memory for said time interval, each of said read ports and each of said write ports separately addressed by said configuration memory.

18. A field programmable gate array as described in claim 17 wherein a logic cycle comprises a plurality of time intervals and further comprising a sequencer circuit for addressing a separate program word of said plurality of program words for each time interval of a logic cycle.

19. A field programmable gate array as described in claim 18 wherein said sequencer circuit comprises means for jumping to a particular address value with which to address said configuration memory.

20. A field programmable gate array as described in claim 17 wherein said plurality of programmable logic modules further comprises:
   a plurality of programmable function generator circuits each having multiple inputs; and
   a plurality of programmable flip-flop circuits; and
   a plurality of programmable I/O modules coupled to integrated circuit pads.

21. A field programmable gate array as described in claim 17 wherein a logic cycle comprises a plurality of time intervals and wherein, for each time interval, said configuration memory programs said plurality of logic modules to realize a separate circuit stage of a circuit and wherein said circuit is realized within said logic cycle.

22. A field programmable gate array as described in claim 21 wherein said information storage memory provides storage for signals required between separate circuit stages of said circuit.

* * * * *